United States Patent [19]

LaPlante et al.

[11] Patent Number: 5,168,454
[45] Date of Patent: Dec. 1, 1992

[54] FORMATION OF HIGH QUALITY PATTERNS FOR SUBSTRATES AND APPARATUS THEREFOR

[75] Inventors: Mark J. LaPlante, Walden, N.Y.; Mark G. LaVine, Milton, Vt.; David C. Long, Wappingers Falls, N.Y.; Poyang Lu, Hopewell Junction, N.Y.; John J. Seksinsky, Poughkeepsie, N.Y.; Lawrence D. Thorp, Yorktown Heights, N.Y.; Gerhard Weiss, La Grangeville, N.Y.

[73] Assignee: International Business Machines Corporation, Armonk, N.Y.

[21] Appl. No.: 428,686

[22] Filed: Oct. 30, 1989

[51] Int. Cl.$^5$ .................... C06F 15/46; B23K 26/00
[52] U.S. Cl. ............... 364/474.08; 364/474.02; 219/121.7; 219/121.8
[58] Field of Search ............ 364/474.08, 474.02; 356/237, 241; 219/121.8, 121.7

[56] References Cited

U.S. PATENT DOCUMENTS

| | | | |
|---|---|---|---|
| 3,696,504 | 10/1972 | Cupler, II | 29/558 |
| 3,730,039 | 5/1973 | Fedrigo | 83/170 |
| 3,757,125 | 9/1973 | Okada et al. | 250/202 |
| 3,867,560 | 9/1989 | Kunitsugu | 219/121.76 X |
| 3,902,036 | 8/1975 | Zaleckas | 219/121 L |
| 4,115,683 | 9/1978 | Clark et al. | 219/121.7 |
| 4,201,905 | 5/1980 | Clark et al. | 219/121 L |
| 4,319,839 | 3/1982 | Durvan | 356/153 |
| 4,425,829 | 1/1984 | Kranik et al. | 83/62.1 |
| 4,520,816 | 6/1985 | Schachar | 128/303.1 |
| 4,544,442 | 10/1985 | Lassen | 156/643 |
| 4,555,798 | 11/1985 | Broadbent et al. | 382/8 |
| 4,724,298 | 2/1988 | Hawkins et al. | 219/121.76 X |
| 4,789,770 | 12/1988 | Kasner et al. | 219/121.7 |
| 4,808,000 | 2/1989 | Pasciak | 356/400 X |
| 4,821,614 | 4/1989 | Fleet et al. | 83/100 |
| 4,884,889 | 12/1989 | Beckwith, Jr. | 356/375 |
| 4,956,546 | 9/1990 | Nishibe et al. | 250/203.1 |

OTHER PUBLICATIONS

IBM TDB, vol. 13, No. 9, Feb., 1971, p. 2536, "Multiple Via Punch", C. J. Lucas, et al.
IBM TDB, vol. 16, No. 12, May 1974, pp. 3933–3934, "Air Spring" Programmable via Punching Head, J. R. Kranik, et al.
IBM TDB, vol. 20, No. 4, Sep. 1977, pp. 1379–1380, "Automated Punch Apparatus for Forming via Holes in a Ceramic Green Sheet", T. J. Cochran and R. G. Haas.

Primary Examiner—Robert W. Beausoliel
Assistant Examiner—Allen M. Lo
Attorney, Agent, or Firm—Ira David Blecker

[57] ABSTRACT

An apparatus and method for accurately and rapidly machining a workpiece, particularly for drilling holes smaller than can be formed by other methods, by using a high power pulsed Nd:YAG laser. A low power HeNe laser is joined to the optical path of the high power laser. The colinear beams then scan along one axis of the workpiece. The low power beam is partially split off to a location determining device before final deflection to the workpiece. Deflection in a second axis is achieved by linearly moving the workpiece so that the beam will impinge upon the desired location of the workpiece.

15 Claims, 4 Drawing Sheets

FORMATION OF HIGH QUALITY PATTERNS FOR SUBSTRATES AND APPARATUS THEREFOR

TECHNICAL FIELD

The invention relates to methods and apparatus for machining a workpiece such as an electronic device substrate with the aid of a high energy beam. More particularly, in a preferred embodiment, this invention relates to methods and apparatus for accurately and rapidly producing holes and other features in an electronic substrate which are smaller than those currently attainable by other methods.

DESCRIPTION OF PRIOR ART

High energy beams (hereafter lasers, although it should be understood that other high energy beams such as electron beams are also contemplated within the scope of the present invention) have been used to machine a variety of workpieces and this activity has been widely reported in the literature. Examples of using lasers to drill holes in electronic substrates are described in U.S. Pat. No. 4,544,442 and in U.S. Pat. No. 4,789,770. An apparatus combining laser machining with a mechanical punch is shown in U.S. Pat. No. 4,201,905.

One of the problems with laser drilling is the non-uniformity of the hole due to the existence of residue from the drilling process in the heat-affected area. A method of solving this problem by using a secondary reaming operation to increase the diameter of the hole beyond the heat-affected area is disclosed in U.S. Pat. No. 3,696,504.

A rotary metal removing operation such as reaming is not adaptable to extremely small hole diameters or high production rates, however. These types (small hole diameter or high production rates) of applications require a pulsed, high power laser which, if not accurately positioned, can improperly machine or ruin the workpiece. Because of this pulsing, it is not possible to use the beam to determine the machining position, since any possible damage will have already occurred by the time the position is determined. It is therefore desirable for a low energy continuous laser, such as a HeNe laser, to be colinear with the high energy laser. By using this low energy laser to determine the position of the high energy laser, accurate machining can be performed. A control system which allows implementation of this idea is described in U.S. Pat. No. 3,902,036. Use of a similar control system for opthalmic applications in described in U.S Pat. No. 4,520,816.

In the current manufacture of multilayer ceramic (MLC) substrates for integrated circuit semiconductor package structures, a plurality of green ceramic sheets is formed by doctor blading a slurry containing a resin binder, a particulate ceramic material, solvents, and a plasticizer, drying the doctor bladed sheet and cutting it into appropriate sized sheets. Via holes are then mechanically punched for forming electrical interconnections through the sheet. Electrically conductive paste is deposited in the holes, and in appropriate patterns on the surface of the sheets, the sheets stacked and laminated, and the assembly subsequently fired at an appropriate sintering temperature. Punching the via holes in ceramic sheets presents formidable engineering problems in view of the small size, high density, and the complex patterns of the via holes. Apparatus used to perform these operations are described in IBM Technical Disclosure Bulletin (TDB) Vol. 13, No. 4, Feb 13, 1971 P. 2536; IBM TDB Vol. 16, No. 12, May 1974 p.3933; IBM TDB Vol. 20, No. 4, Sep. 1977 P. 1379; and U.S. Pat. Nos. 4,425,829; 3,730,039; and 4,821,614, the disclosures of which are incorporated by reference herein.

The mechanical punching technology currently used to manufacture MLC substrates has several limitations. The aspect ratio of a hole should theoretically be no less than one, that is the diameter should not be less than the thickness of the sheet to be punched. As the miniaturization of electronic devices continues, the requirement that smaller via holes be used increases. A certain minimum sheet thickness is necessary, however, for the mechanical integrity of the structure.

In addition to requiring smaller diameter holes, future electronics devices will require that the holes be spaced closer together. Use of a mechanical punch at these geometries causes greatly increased embossing of the green sheet, which can greatly distort the via pattern. Existing technology limits the diameter of holes in MLC substrates to approximately 3.5 mils.

Given the requirement for smaller and more closely spaced features in MLC substrates, a need exists for an apparatus and a method which use advanced technology to manufacture substrates with the required geometries. This apparatus and method must be able to accurately and rapidly machine features in these substrates in order to provide the necessary feature geometries and yet remain competitive with existing mechanical devices such as the multiple-punch apparatus described in U.S. Pat. No. 4,425,829.

A need also exists for an apparatus and method for verifying that the features machined in the workpiece are correctly located. Although a separate apparatus for performing this function has been previously described, for example in U.S. Pat. No. 4,555,798, a need exists for an apparatus and method which are capable of being integrated into the machining apparatus and method.

BRIEF SUMMARY OF THE INVENTION

In accordance with the present invention, we provide a machining apparatus. More specifically, the invention is a machining apparatus including a high energy machining beam, a low energy positioning and verifying beam, a means for colinearly joining the low energy and high energy beams, means for rapidly scanning the colinear beams along a first axis, means for translating a workpiece along a second axis wherein the second axis is orthogonal to the first axis, means for at least partially separating the optical paths of the high energy and low energy beams, means for determining the location at which the high energy beam will impinge upon the workpiece and thereafter positioning the high energy beam, wherein the means comprises utilizing the separated low energy beam, and in-process means for verifying the accuracy of the machining operation.

This invention also provides a method for machining a workpiece which includes the steps of colinearly joining a low energy positioning and verifying beam and a high energy machining beam, rapidly scanning the colinear beams along a first axis, translating the workpiece along a second axis wherein the second axis is orthogonal to the first axis, at least partially separating the low energy beam from the optical path of the high energy beam, impinging the portion of the low energy beam separated from the high energy beam onto a position detector in order to accurately locate and position the high energy beam, impinging the high energy beam on the workpiece so as to machine a predetermined pattern of features on the workpiece, and verifying in-process the accuracy of the machining operation.

In addition to a machining apparatus, this invention also provides an apparatus for verifying machining operations. More specifically the invention is a verifying apparatus which includes means for generating a beam of light, means for rapidly scanning the beam along a first axis, means for translating a workpiece along a second axis wherein the second axis is orthogonal to the first axis, a photocell located proximate to the workpiece such that the beam impinges upon the photocell, and an electronic circuit that compares the location of the impingement of the beam on the photocell with a predetermined location.

This invention also provides a method for verifying the accuracy of a machining operation which includes generating a beam of light, rapidly scanning the beam along a first axis, translating a workpiece along a second axis wherein the second axis is orthogonal to the first axis, locating a photocell proximate to the workpiece such that the beam impinges upon the photocell, and comparing the location of the impingement of the beam on the photocell with a predetermined location, using an electronic circuit.

BRIEF DESCRIPTION OF DRAWINGS

In the accompanying drawings forming a material part of this disclosure.

DETAILED DESCRIPTION OF THE INVENTION

Figure 1:
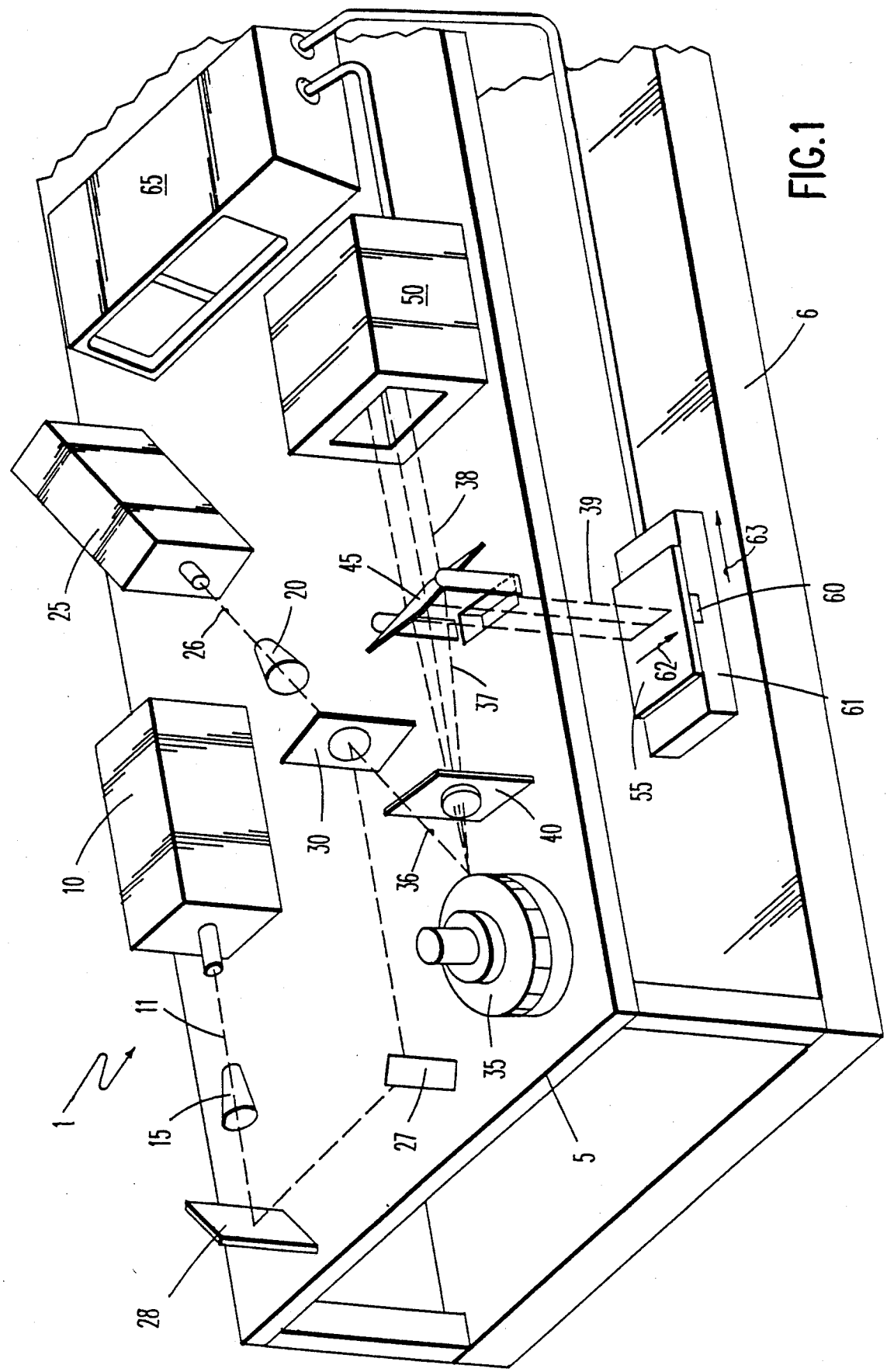
FIG. 1 is a perspective view of the overall apparatus of the invention including the general relationship between the laser system, the control system, and the workpiece and associated translation device.

Referring to the drawings in more detail and particularly referring to FIG. 1, there is shown the machining apparatus 1 according to the present invention. The machining apparatus 1 comprises a means for generating a high energy machining beam of pulsed or continuous nature and a means for generating a low energy positioning and verifying beam. For the purposes of the present invention, the preferred high energy beam is a Nd:YAG laser 10 and the preferred low energy beam is a HeNe laser 25. It should be understood, of course, that this choice of lasers is not meant to be exhaustive as there are other combinations of lasers and beams which will adequately fulfill the objects of the present invention, including multiple lasers suitably multiplexed.

Next, the machining apparatus comprises a means for colinearly joining the low energy positioning and verifying beam and the high energy machining beams. The preferred means is a dichroic mirror 30.

An important aspect of the present invention is a means for rapidly scanning the colinear beams along a first axis. The importance of the scanning means will become more apparent hereafter. As shown in FIG. 1, the preferred scanning means is a rotating polygonal mirror 35.

Also provided is a means for translating a workpiece along a second axis. This translation means is translation device 61. The second axis is orthogonal to the first axis.

The machining apparatus 1 further comprises a means for at least partially separating the optical paths of the high-energy machining beam and the low energy positioning beam. In the present invention, the separating means is dichroic mirror 45.

Another feature of the present invention is a means for determining the location at which the high energy machining beam will impinge upon the workpiece and thereafter positioning the high energy machining beam. This determining means comprises utilizing the separated low energy positioning and verifying beam, as separately described above. The determining means includes photodetector unit 50 and computer 65. Finally, the machining apparatus comprises an in-process means for verifying the accuracy of the machining operation. This verifying means includes strip photodetector 60 in conjunction with computer 65.

As shown in FIG. 1, a bench or table 5 supports several components of the apparatus, including a Nd:YAG laser 10, a HeNe laser 25, a rotating polygonal mirror 35, dichroic mirrors 30, 45, a photodetector unit 50, and a personal computer 65, which contains the necessary control circuitry. The base 6 of the bench or table supports the workpiece 55, the workpiece translation device 61, and the strip photodetector 60.

The Nd:YAG laser 10 produces a beam 11 with a wavelength of 1.06 microns and a diameter of approximately 1 mm. The beam 11 is pulsed and has an average power in the range of approximately 3–10W. After exiting the Nd:YAG laser 10 the beam 11 passes through an expander 15 which performs a collimating function to maintain the parallelism of the beam 11. The HeNe laser 25 produces a beam 26 with a wavelength of 0.63 microns and a diameter of approximately 1 mm. The beam 26 is continuously powered with a power in the range of approximately 1–5 mw. The HeNe beam 26 also passes through an expander 20 which performs the same function for the HeNe beam 26 as the expander 15 performs for the Nd:YAG beam 11.

After the Nd:YAG beam 11 passes through the expander 15, it is reflected through an angle of approximately 180 degrees by mirrors 27, 28 and impinges upon and is reflected by dichroic mirror 30, which acts as a beam joiner. The HeNe beam 26 impinges upon the opposite side of dichroic mirror 30, which is transmissive of the beam of wavelength 0.63 microns, and is colinearly joined with the Nd:YAG beam 11. The colinearly joined beams 36, which consist of the continuous HeNe positioning and verifying beam 26 and pulses of the Nd:YAG machining beam 11, then impinge upon a device for rapidly scanning them along a first axis 62, for example a rotating polygonal mirror 35, and are reflected through a flat field lens 40, which acts to keep the focal point at the proper spatial position, even though the beams are scanning. The diameter at the beam at point at which it impinges upon the workpiece (55) may be adjusted by varying the beam expander (15)

ratio, thus operating the flat field lens (40) at a different f-number.

The colinearly joined scanning beams 37 next impinge upon an apparatus for separating the beams, for example a dichroic mirror 45. The dichroic mirror 45 at least partially transmits the HeNe positioning beam 38 and reflects the Nd:YAG machining beam 39 onto the workpiece 55. The scanning partially transmitted HeNe positioning beam 38 then impinges upon a photodetector 50, creating a signal which is analyzed by an electronic circuit in a device such as a personal computer 65. By comparing the position of the positioning beam 38 at a given instant with a desired machining location on the workpiece 55, the computer can determine when to pulse the machining laser 10, as will be explained in more detail hereafter.

Figure 2:
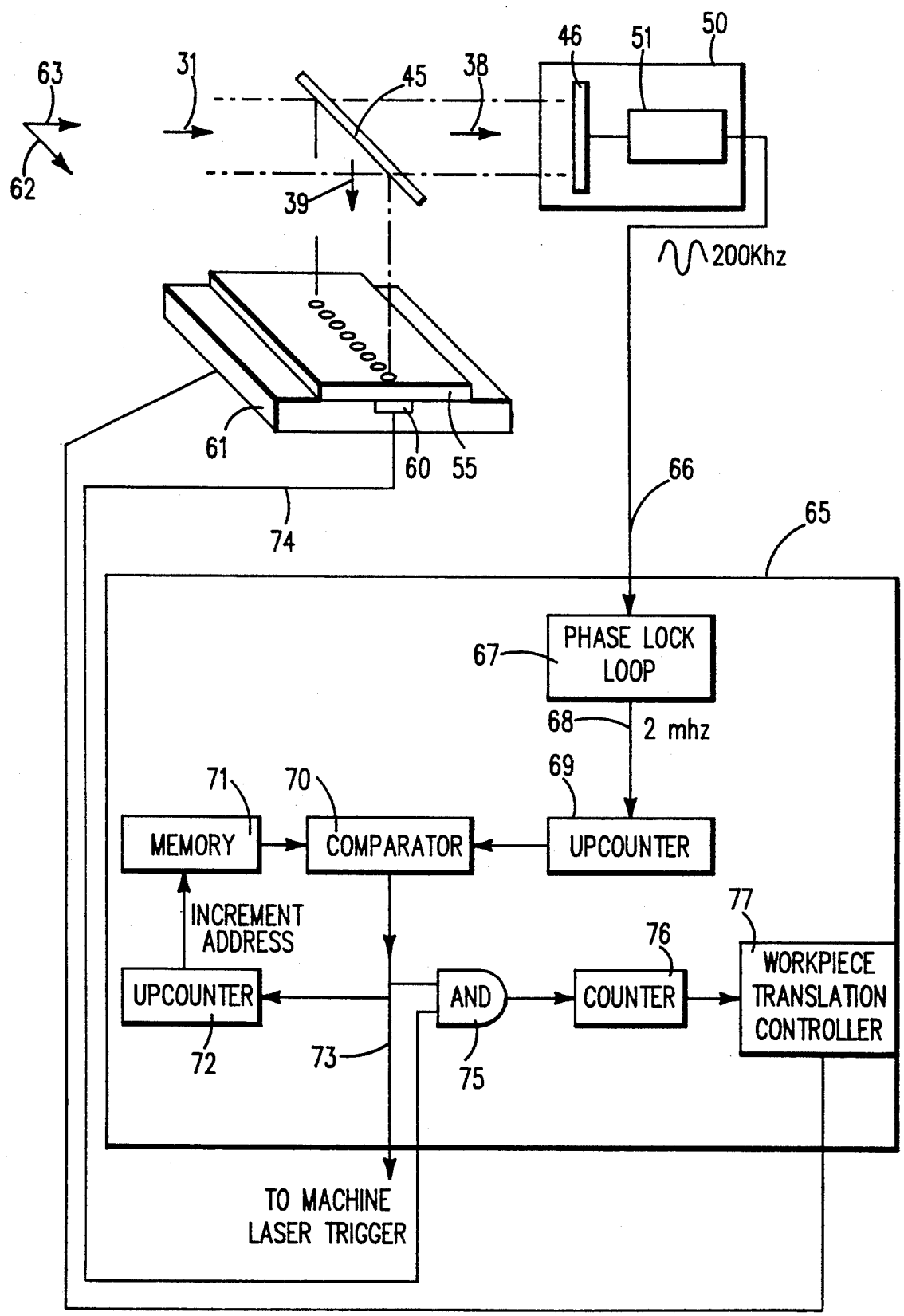
FIG. 2 is a block diagram illustrating the function of the control system along with the pertinent components of the optical system.

Referring to FIG. 2, the apparatus which performs this positioning function is described in more detail. The scanning positioning beam 38 enters the cavity of the photodetector unit 50 and passes through a grating 46 before impinging upon a photoelectric device 51. This creates an approximately sinusoidal signal 66 at a frequency of approximately 200 khz which corresponds to a sequence of discreet positions in the first axis 62 across which the positioning beam scans. The 200 khz signal 66 is processed in a phase lock loop 67, creating a 2 Mhz signal 68. This signal 68 is the input to an upcounter 69, the output of which is compared by comparator 70 with a binary number, corresponding with the desired machining location, previously loaded into memory 71. When the upcounter 69 output matches the number in memory 71 the comparator 70 will produce an output 73 which triggers the Nd:YAG laser, which will then fire, so that the machining beam 39 impinges upon the workpiece 55 in the proper location. The output 73 of the comparator 70 is also an input to upcounter 72, which then sends an increment address signal to memory 71, causing it to load the binary number corresponding to the next desired machining location.

The workpiece 55 can be translated along the second axis 63, which is orthogonal to the first axis 62 by a mechanical device, for example translation table 61. This translation can be performed after a pre-determined number of pulses have been fired by the Nd:YAG laser or after a verifying device has determined that the appropriate features have been machined along the first axis 62 for a given location on the second axis 63. This verifying device is an integral part of the laser machining system, but can also be a separate article of commerce. By scanning the high energy machining beam and the low energy positioning and verifying beam along the first axis 62 and then translating the workpiece 55 along the second axis 63 whereafter the scanning along the first axis 62 is repeated, the workpiece 55 can thus be scanned and machined in a raster-like fashion. The embodiment shown in FIG. 1 incorporates the verifier into the machining system.

The block diagram of FIG. 2 also depicts the operation of the verifier. When a hole or other feature is machined in workpiece 55, the beam 39, a combination of the machining beam and the partially reflected positioning and verifying beam, impinges upon the strip photodetector 60. In this preferred embodiment the photodetector is located beneath the workpiece, but it can be located elsewhere, with the beam 39 impinging on it through suitable reflective means (not shown). This may be essential if a particular machining operation does not require features to be machined through the thickness of the workpiece 55. The output 74 of the photodetector strip 60, which indicates where a feature is actually machined, is then an input to an AND device 75, along with the output 73 of comparator 70, which indicates where a feature should be machined. If these two signals 73, 74 correspond, the AND device will have an output, verifying that a feature has been machined in a proper location.

Several features will typically be required to be machined along the first axis 62 for a given location of the second axis 63. As the machining and verifying beams 39 proceed along the first axis 62, verifying the machining of each desired feature as described above, the output of the AND device 75 is stored in counter 76. The required number of machining operations for this location of the second axis 63 is input from the memory 71 into the counter 76. When the actual number of operations is equal to the required number of operations, the counter 76 activates the workpiece translation controller 77, which activates the translation table 61, moving the workpiece 55 to the next position along the second axis 63.

Figure 5:
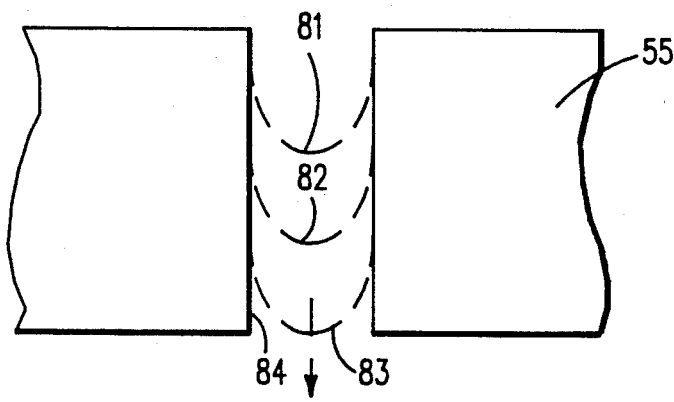
FIG. 5 is a cross-sectional view of a hole produced by successive pulses of a laser.

One of the primary functions of the machining apparatus and method heretofore described is to drill a plurality of small, closely spaced holes. Referring to FIG. 1, the diameter of the hole can be easily adjusted by adjusting the expander 15 which determines the diameter at which the machining beam 11 will impinge upon the workpiece 55 by adjusting the optical system's f-number. Holes smaller than 0.5 mil in diameter can be drilled in this manner. This can be compared with the present mechanical punching technology which is limited to a minimum hole size of approximately 3.5 mil.

Where a consistent hole diameter and lack of a heat-affected zone are primary concerns, the system can also be used. Referring to FIG. 5, the workpiece 55 is successively machined 81, 82, 83, 84 by a series of successive pulses. This method assures a consistent, high quality hole.

Figure 4:
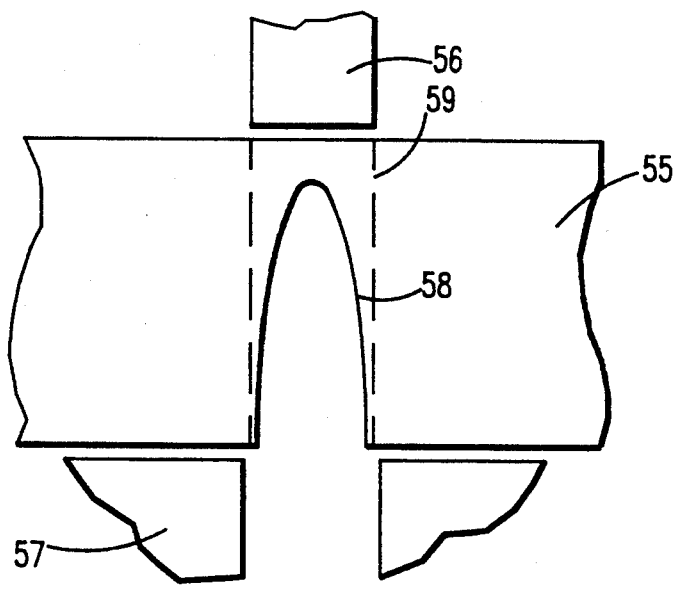
FIG. 4 is cross-sectional view of a system which combines a laser and mechanical operation to produce a uniform hole.

FIG. 4 shows another method and apparatus for achieving a consistent, high quality hole. A hole 58, which is smaller than the diameter ultimately desired, is drilled by the laser in the workpiece 55. The hole 58 may extend partially or completely through the workpiece 55. A mechanical punch 56 and die 57 are then used to achieve the final diameter 59. Holes produced in this manner solve the prior art problem of embossing the workpiece 55 and have no heat-affected zone, although they cannot be produced with as small a diameter as a hole manufactured using only a laser, as previously described.

Figure 6:
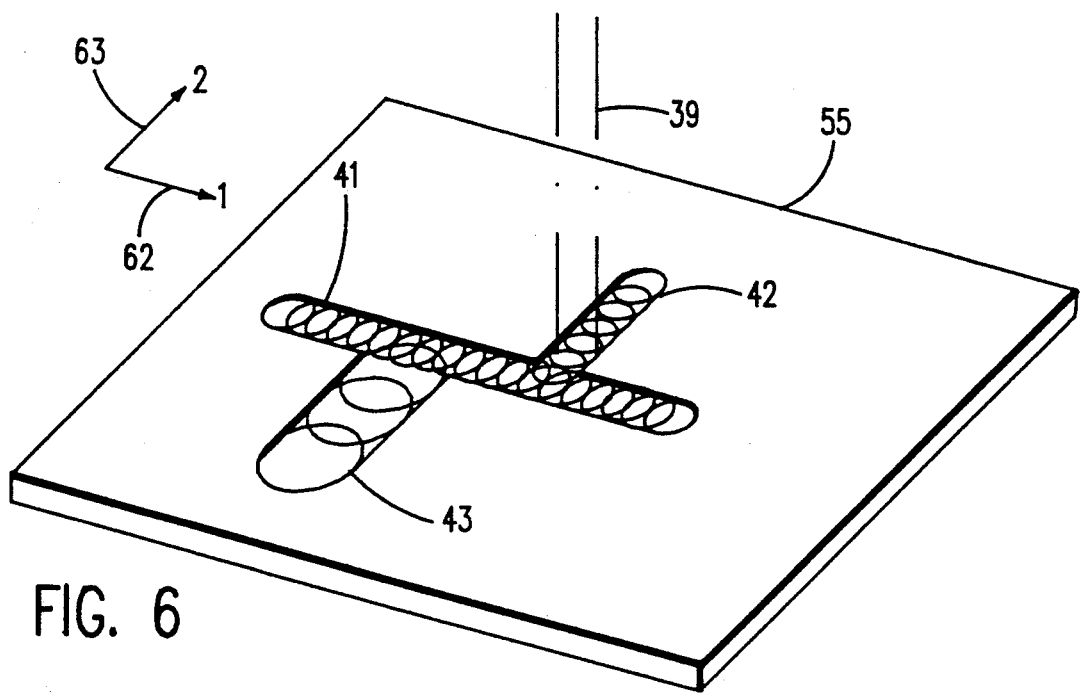
FIG. 6 is a perspective view of a two-dimensional pattern formed on a workpiece using different focal length beams.

The described apparatus and method can also be used to machine features in a substrate other than holes. Referring to FIG. 6, a feature is shown machined in the workpiece 55 which is slotted along the directions of both the first axis 62 and the second axis 63. A slot 41 parallel to the first axis 62 is achieved by stepping the machining beam 39 along all necessary points in the first axis 62 at a given position of the second axis 63. A slot parallel to the second axis 63 is achieved by machining a single feature at a given first axis 62 and second axis 63 position, translating the workpiece 55 to the next second axis 63 position, machining again at the same first axis 62 position such that the second machined feature overlaps the first machined feature, and continuing this sequence until the entire slot is machined. Slots 42, 43 are produced in this manner. As previously described, features of various shapes and sizes may be produced on a given workpiece 55, by varying the size of the machining beam 39, using the beam expander 15, shown in FIG. 1.

Although the present invention has been described in terms of machining operations, it can also be deposit material. For example, the inventor can be used for laser chemical metal vapor deposition in an evacuated vacuum chamber.

Referring to FIGS. 1 and 2, the scanning positioning beam 38 scans faster than the machining beam 39 can optimally fire. A data sort in the personal computer 65 breaks an individual scan line into data points which are separated by a minimum distance required quotient, as determined by the optimum laser pulse rate. For example, if the scan rate is 1 in/ms and the optimum pulse rate is 5 Khz (200 usec/pulse), then the minimum distance between holes would be 0.2 in. The required quotient may be defined then as the rate at which the high energy machining beam scans the workpiece divided by the optimum pulse rate. The personal computer 65 would then sort the data so that consecutive holes that are impinged upon by the beam 39 would be at least 0.2 in apart. Holes that fall within this 0.2 in distance would be drilled on successive first axis 62 passes at a given second axis 63 location. In a similar manner, beam 39 may make successive passes along first axis 62 if multiple laser pulses are required, or desired, for each hole.

Figure 3A:
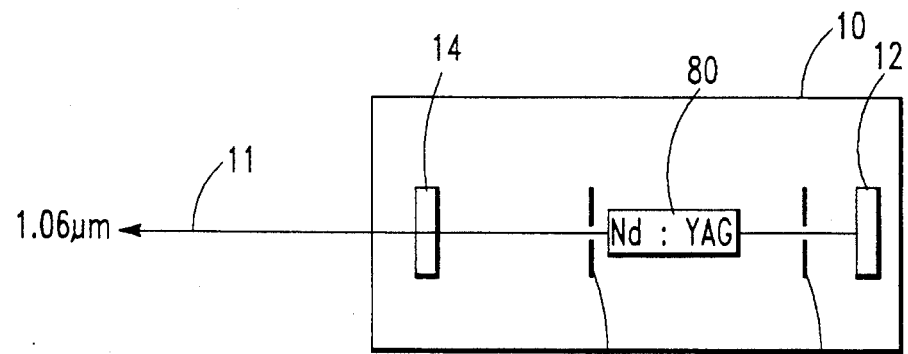
FIGS. 3A–3C illustrate the different wavelengths of machining beams which can be produced using a common Nd:YAG laser.
Figure 3B:
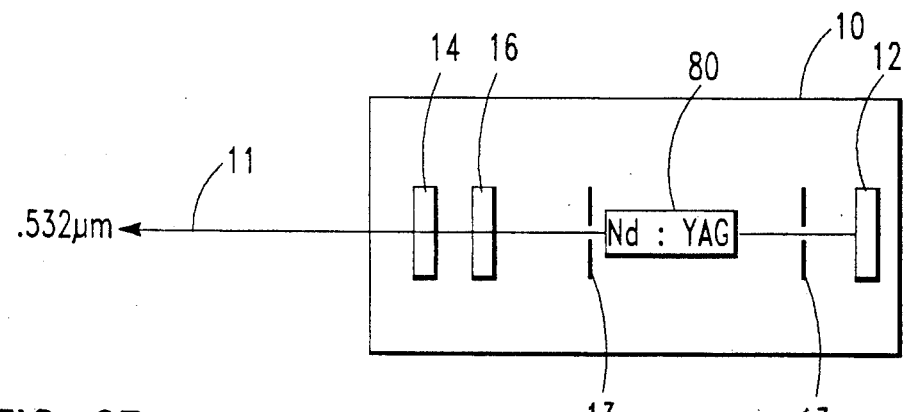
Figure 3C:
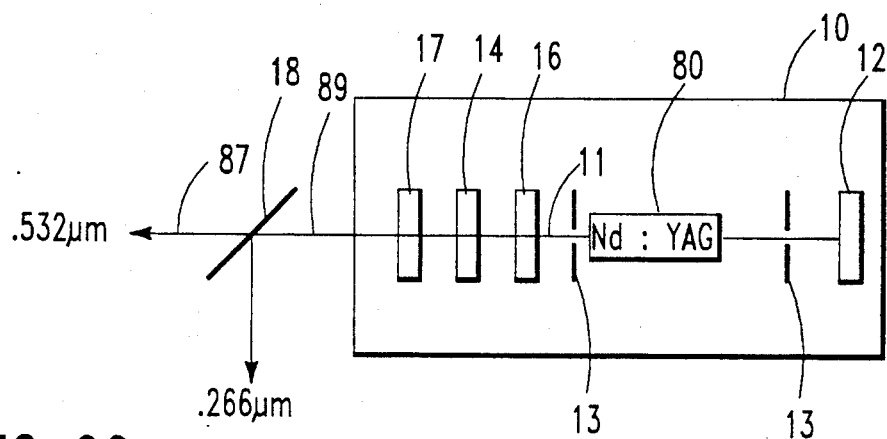

To be able to machine a variety of workpiece 55 materials, it is desirable to be able to modify the wavelength of the machining beam 11. Referring to FIG. 3, the internal components of the Nd:YAG laser 10 are shown. In its primary wavelength configuration, shown in FIG. 3(A), the laser 10 consists of a Nd:YAG cw arc lamp pumped cavity 80, a front mirror 14, a rear mirror 12, and two apertures 13. The wavelength of the beam 11 produced is 1.06 um, suitable for machining materials such as ceramic green sheets for electronic substrates. An alternate configuration, shown in FIG. 3(B), produces a beam with a wavelength of 0.532 um. This configuration is achieved by inserting a crystal 16, composed of either Lithium Iodate or Potassium Titanyl Phosphate, between the front mirror 14 and the front aperture 13. Another alternate configuration is shown in FIG. 3(C). The beam 83 passes through a Potassium Titanyl Phosphate crystal 16, located between the front aperture 13 and the front mirror 14, and then through a Beta-Barium-Borate crystal 17, located in front of the front mirror 14, and is separated into two components, one with a wavelength of 0.532 um and one 89, then passes through a dichroic mirror 18, which transmits the 0.532 um beam 87 and reflects the 0.266 um beam 88. The 0.266 um beam 88 is of particular importance in the machining of polyimide, an important insulating coating for electronic substrates. It can also be used to machine other dielectric materials such as teflon, epoly fiberglass, or other polymeric materials.

With the teaching of the present invention, further modification of the wavelength of the machining beam 11 is possible.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

What is claimed is:

1. A machining apparatus comprising:

means for generating a high energy machining beam;
    means for generating a low energy positioning and verifying beam;
    means for colinearly joining the low energy positioning and verifying and the high energy machining beams;
    means for rapidly scanning the colinear beams along a first axis of a workpiece;
    means for at least partially separating the optical paths of the high energy machining and low energy positioning and verifying beams prior to scanning a workpiece;
    means for determining the location at which the high energy machining beam will impinge upon a workpiece and thereafter positioning the high energy machining beam, wherein said determining means comprises utilizing said separated low energy positioning and verifying beam;
    means for translating a workpiece along a second axis wherein said second axis is orthogonal to said first axis and wherein the high energy machining beam and the low energy positioning and verifying beam, by scanning the beams along the first axis of a workpiece and then translating a workpiece along the second axis, scan and machine a workpiece in a raster-like fashion; and
    in-process means for verifying the accuracy of the machining operation, proximate to said translating means, wherein said in-process means comprises utilizing at least one of said beams to verify the location at which the high energy beam has impinged a workpiece.

2. The apparatus of claim 1 wherein the high energy machining beam comprises a Nd:YAG laser and the low energy positioning and verifying beam comprises a HeNe laser.

3. The apparatus of claim 1 wherein the high energy machining beam is used to drill holes having a diameter smaller than about 3.5 mils.

4. The apparatus of claim 1 further comprising means for varying the wavelength of the high energy machining beam, said varying means inserted between the high energy machining beam and the means for colinearly joining the high energy machining and low energy positioning and verifying beams.

5. The apparatus of claim 1 wherein said high energy machining beam is used to drill a hole of a first predetermined dimension at least partially through the workpiece and further comprising a mechanical punch which enlarges said hole to a second predetermined dimension.

6. The apparatus of claim 1 wherein said scanning means comprises a polygonal mirror.

7. An apparatus for verifying machining operations comprising:

means for generating a beam of light;
    means for rapidly scanning the beam along a first axis of a workpiece to be machined;
    means for translating a workpiece along a second axis wherein said second axis is orthogonal to said first axis;
    a photocell located proximate to a workpiece such that the beam impinges upon said photocell after passing through, or being reflected by, a feature machined in the workpiece; and
    an electronic circuit that compares the location of the impingement of said beam on the photocell with a predetermined location.

8. The apparatus of claim 7 wherein said scanning means comprises a polygonal mirror.

9. A method for machining a workpiece which comprises the steps of:
colinearly joining a low energy positioning and verifying beam and a high energy machining beam;
rapidly scanning the colinear beams along a first axis of a workpiece;
translating a workpiece along a second axis wherein the second axis is orthogonal to the first axis;
at least partially separating the low energy positioning and verifying beam from the optical path of the high energy machining beam;
impinging the portion of the low energy positioning and verifying beam separated from the high energy machining beam onto a position detector in order to accurately locate and position the high energy machining beam;
impinging the high energy machining beam on a workpiece so as to machine a predetermined pattern of features on a workpiece and wherein the high energy machining beam and the low energy positioning and verifying beam, by scanning the beams along the first axis of a workpiece and then translating a workpiece along the second axis, scan and machine a workpiece in a raster-like fashion; and
verifying in-process the accuracy of the machining operating by impinging at least one of said beams proximate to a workpiece so as to verify the location at which the high energy beam has impinged a workpiece.

10. The method of claim 9 where the step of impinging the high energy machining beam on the workpiece comprises drilling holes having a diameter smaller than about 3.5 mils.

11. The method of claim 9 wherein the step of impinging the high energy beam on the workpiece comprises optimizing the impinging of the high energy machining beam on the workpiece wherein a required quotient between features is less than the rate at which the high energy machining beam scans the workpiece divided by the optimum pulse rate, the step of optimizing comprising:
impinging the high energy machining beam on features which are equal in spacing to, or greater in spacing than said quotient, thereby skipping adjacent features having a required spacing less than said quotient; and
stepping the workpiece through successive passes until all features are impinged.

12. The method of claim 9 wherein a uniform hole with a minimum irregularity in the diameter throughout the length of the hole is achieved by using multiple pulses per hole.

13. The method of claim 9 wherein a uniform hole with a minimum irregularity in the diameter throughout the length of the hole is achieved by first using the high energy machining beam to drill a hole smaller than the desired diameter at least partially through the workpiece, the further step comprising mechanically punching said hole to a final diameter, thereby removing any residue which may exist from the drilling operation.

14. The method according to claim 9 wherein the step of impinging the high energy machining beam on the workpiece comprises generating a channel structure in the workpiece by multiply pulsing the high energy machining beam along a predetermined path.

15. A method for verifying the accuracy of a machining operation comprising:
generating a beam of light;
rapidly scanning the beam along a first axis of a workpiece to be machined;
translating a workpiece along a second axis wherein said second axis is orthogonal to said first axis;
locating a photocell proximate to a workpiece such that the beam impinges upon said photocell after passing through, or being reflected by, a feature machined in the workpiece; and
comparing the location of the impingement of said beam on the photocell with a predetermined location, using an electronic circuit.

* * * * *